United States Patent [19]

Seino et al.

[11] Patent Number: 4,853,649
[45] Date of Patent: Aug. 1, 1989

[54] DISTRIBUTED FET AMPLIFIER AND BIAS VOLTAGE SUPPLY CIRCUIT THEREFOR

[75] Inventors: Kiyoharu Seino; Tadashi Takagi; Fumio Takeda; Yukio Ikeda, all of Kanagawa, Japan

[73] Assignee: Mitsubishi Denki Kabushiki, Tokyo, Japan

[21] Appl. No.: 151,625

[22] Filed: Feb. 2, 1988

[30] Foreign Application Priority Data

Feb. 12, 1987 [JP] Japan .................. 62-30553

[51] Int. Cl.$^4$ .............................................. H03F 3/60
[52] U.S. Cl. ....................................... 330/277; 330/54; 330/286; 330/295; 330/297; 330/307
[58] Field of Search ................. 330/54, 277, 286, 296, 330/297, 295, 307; 333/202, 204, 246, 247

[56] References Cited

U.S. PATENT DOCUMENTS 4,291,286 9/1981 Wagner .............................. 330/54 X
4,327,342 4/1982 De Ronde .......................... 333/204

OTHER PUBLICATIONS

Lee, "MOSFETS Rejuvenate Old Design for Catv Broadband Amplifiers", *Electronics*, vol. 44, No. 6, Mar. 15, 1971, pp. 72-75.

*Primary Examiner*—James B. Mullins
*Attorney, Agent, or Firm*—Wolf, Greenfield & Sacks

[57] ABSTRACT

A distributed FET amplifier comprising an array of FET elements each having a gate terminal, a drain terminal and a source terminal. The gate terminals of the adjacent FET elements are connected by a first inductor, and the drain terminals of the adjacent FET elements are connected by a second inductor. Between the source terminals of each of the FET elements and the ground is connected a parallel circuit comprising a capacitor having a capacitance greater than the gate-source capacitance of the FET element and an impedance element connected in parallel to the capacitor for grounding the direct current. A bias voltage supply circuit for supplying a bias voltage to such as distributed amplifier is also disclosed.

29 Claims, 19 Drawing Sheets

DISTRIBUTED FET AMPLIFIER AND BIAS VOLTAGE SUPPLY CIRCUIT THEREFOR

BACKGROUND OF THE INVENTION

1. Technical Field of the Invention

This invention relates to a distributed FET amplifier and a bias voltage supply circuit therefor, and more specifically, to a distributed FET amplifier used in a micro-wave range for communication, radar and the like, and a bias voltage supply circuit for preventing the distributed FET amplifier from being affected by a voltage source.

2. Description of the Prior Art

FIG. 1 shows an equivalent circuit of the distributed FET amplifier described in "A monolithic GaAs 1–13 GHz traveling-wave amplifier" (edited by Y. Ayasle, et al, IEEE Trans. vol. MTT-30, pp. 976–981, July 1982). In this circuit, four FET (field effect transistor) elements are used. In this figure, reference numerals 1, 2, and 3 designate an input terminal, an output terminal, and the FET elements, respectively. Also, reference numerals 4, 5 and 6 designate respectively the gate terminal, the drain terminal, and the source terminal of said FET elements 3. Inductor elements 7, 8 and terminating devices 9, 10 are also used in this amplifier.

In operation, a microwave power applied to input terminal 1 sequentially propagates through inductor elements 7 toward terminating devices 9. During propagation, the microwave is partially supplied to gate electrodes 4 of FET elements 3 by means of which it is amplified. The microwave power thus amplified sequentially propagates through inductor elements 8 to output terminal 2. Terminating devices 9 and 10 are adapted not only to absorb unnecessary microwave power but also to improve reflection characteristics at input terminal 1 and output terminal 2 so that the gain of the circuit can be kept flat over a wide frequency band.

A typical equivalent circuit of a conventional FET element is shown in FIG. 2. In this figure, reference symbols Cgs, Rg, gm, Cds, and Rds represent the gate-source capacitance of capacitor 11 constituted between the gate and the source electrodes, gate resistance, mutual conductance, drain-source capacitance, and drain-source resistance, respectively. In operation, when microwave power is applied to gate terminal 4, a microwave voltage v is developed across capacitor 11 between the gate and source electrodes. This voltage is amplified by the mutual conductance gm to produce a current source v gm. Since the gate-drain capacitance Cgd is normally very small and can be to all intents and purposes ignored, the equivalent circuit of FIG. 1 can be regarded as consisting of a gate side equivalent circuit as shown in FIG. 3(a) and a drain side equivalent circuit as shown in FIG. 3(b). It should be noted that both FIG. 3(a) and FIG. 3(b) show a circuit equivalent to a distributed constant line having loss.

The characteristic impedance Zo of said distributed constant line is constant regardless of frequency. Therefore, if proper inductor elements 7 and 8 having reactances corresponding to the internal capacitances Cgs and Cds of FETs 3 and terminating devices 9 and 10 are used, it is possible to obtain an amplifier which allows a small reflection over a wide frequency band.

However, as shown in FIG. 3(a), the gate side equivalent circuit is equivalent to a distributed constant circuit having a loss due to resistance Rg. Furthermore, since microwave voltages v1, v2, v3 and v4 developed across capacitors 11 between gate and source normally have the following relationship:

$$v1 > v2 > v3 > v4 \qquad (1)$$

FET elements 3 are not excited uniformly. This tendency becomes more significant as the frequency becomes higher. This means that as the frequency gets higher, the amplification of the microwave power input becomes less efficient. Thus, the prior art distributed FET amplifier is disadvantageous in that its gain is lowered in a high frequency range.

FIG. 4 is an equivalent circuit of another example of the prior art distributed FET amplifier, which combines by a normal T-branch outputs from two travelling-wave FET amplifiers, as described in "MESFET Distributed Amplifier Design Guidelines" (J. B. Beyer, et al, JEEE Trans., vol. MTT-32, No. 3, pp. 268–275, Mar. 1984). In the figure, reference numerals 1 and 2 designate an input terminal and an output terminal respectively; 3a and 3b designate FETs; 4a, 5a and 6a designate a gate terminal, drain terminal, and source terminal of FET 3a, respectively; 4b, 5b and 6b designate a gate terminal, drain terminal, and source terminal of FET 3a respectively; 7a, 7b, 8a and 8b designate inductors: 9a, 9b, 10a and 10b designate terminating devices; and 12 and 13 designate T-branches.

In operation, the microwave power applied to input terminal 1 is divided in half by T-branch 12. One of the two halves of the microwave power propagates through inductors 7a toward terminating device 9a. During propagation, the microwave power is partially supplied to each of FETs 3a by which it is amplified. The microwave power thus amplified propagates through inductors 8a to T-branch 13. The other half of the microwave power divided by T-branch 12 propagates through inductors 7b toward terminating device 9b. During propagation, the microwave power is partially supplied to each of FETs 3b by which it is amplified. The microwave power thus amplified propagates through inductors 8b to T-branch 13. The two microwave power components are combined at T-branch 13. The microwave power thus combined is passed to output terminal 2.

The operation of such a distributed FET amplifier of the power combining type will be further described hereinafter.

For the sake of brevity, it is assumed that all FETs 3a and 3b have the same configuration, that the inductance value of inductors 7a and 7b is constant and of a value Lg/2, the inductance value of inductors 8a and 8b being constant and of a value Ld/2, and that terminating devices 9a and 9b and terminating devices 10a and 10b have the same properties, respectively.

As already described with reference to FIG. 2, the microwave power applied to a gate terminal is amplified by the mutual conductance gm in the FET, and is produced at the drain terminal. Thus, amplification is effected. The gate-drain capacitance Cds (FIG. 2) is normally very small and to all intents and purposes can be ignored. Thus, the equivalent circuit of FIG. 4 can be represented by a gate side equivalent circuit as shown in FIG. 5(a) and a drain side equivalent circuit as shown in FIG. 5(b). Both the gate side and drain side equivalent circuits are equivalent to a circuit which includes two distributed constant lines having loss and T-branches connecting these distributed constant lines. In general, the characteristic impedance of a distributed constant circuit doesn't change with a change in frequency. Therefore, if suitable inductors 7a, 7b, 8a and 8b and terminating devices 9a, 9b, 10a and 10b which match FETs 3a and 3b are used, an amplifier having excellent VSWR characteristics and flat gain characteristics over a wide frequency band can be obtained.

However, the above mentioned operation is only possible when FETs 3a and 3b have exactly the same characteristics and the two microwaves which have reached T-branch 13 have the same amplitude and are in phase with each other. In general, FETs 3a and 3b have slightly different characteristics due to some dispersion. As a result, the two microwaves which have reached T-branch 13 have different amplitudes and phases. If there is such an imbalance between the power of the two microwaves, the power amounting to the difference between the two microwaves is reflected by T-branch 13. The reflected microwave returns toward the FETs, having adverse effects thereon. As a result, the gain or output of the FETs may be lowered or oscillation may occur.

A way of giving a suitable bias voltage to the FETs shown in FIGS. 1 and 4 is to insert a parallel circuit of a resistor and a capacitor between the source terminal of each FET and the ground. FIG. 6 shows an example of such a bias circuit for operating the FETs of FIG. 1 by a single power source.

The reference numerals 14 and 15 designate a resistor and a capacitor, respectively. This bias circuit includes a parallel circuit composed of resistor 14 and capacitor 15 which are connected between source terminal 6 of FET 3 and the ground. In this arrangement, a voltage applied to drain terminal 5 causes current to flow from drain terminal 5 to source terminal 6, which develops a potential difference across resistor 14. This potential difference allows a desired voltage to be applied to gate terminal 4. Capacitor 15 is used to ground source terminal 6 with respect to microwave power. Gate terminal 4 is grounded with respect to the direct current by a suitable means (not shown in FIG. 6).

FIG. 7 shows an actual configuration of the circuit of FIG. 6, as shown in Japanese Patent Public Disclosure No. 68055/82. The reference numerals 16 and 17 designate a carrier and a metal wire, respectively. A parallel plate capacitor 15 is connected to one end of chip-type FET 3. Chip-type resistor 14 and chip-type capacitor 15 are arranged at the other end of FET 3. FET 3, resistor 14, and capacitor 15 are mounted in a nearly straight line on carrier 16. One of the source terminals of FET 3 is connected through metal wire 17 to capacitor 15 and the other one of the source terminals is connected to capacitor 15, resistor 14 and carrier 16 by metal wire 17. Carrier 16 is made of metal and is grounded with respect to the direct current and the microwave current. It should be noted that in the circuit of FIG. 6, one capacitor 15 is connected to source terminal 6, whereas, in FIG. 7, two capacitors each having a capacitance half that of capacitor 15 are used instead of one capacitor 15.

By applying such a bias circuit of FIG. 6 to a known distributed FET amplifier, a distributed amplifying circuit fed by a single power source can be obtained. Such an amplifying circuit comprising a plurality of FETs is shown in FIG. 8. In this figure, the reference numerals 18, 19 and 20 designate distributed constant lines; and 21 designates a terminating resistor. This amplifier includes three FETs 3. Distributed constant lines 18 connect gate terminals 4 of FETs 3, and distributed constant lines 19, 20 connect drain terminals 5 of FETs 3. Resistor 14 and capacitor 15 are connected to source terminal 6 of each FET 3 so that each FET can be operated by a single power source. In FIG. 8 direct current blocking capacitors are omitted.

FIG. 9 shows an example of an actual configuration of the distributed amplifier shown in FIG. 8, FETs 3 being arranged in a nearly straight line. For the sake of brevity, only the circuit construction in the vicinity of two adjacent FETs 3 is shown in the figure. The circuit construction in the vicinity of the remaining FET 3 is similar to this. While chip-type FET 3, chip-type resistor 14 and chip-type capacitor 15 are used in FIG. 7, a monolithic integrated circuit configuration is employed in FIG. 9 because it is difficult to embody such a distributed amplifier by using such chip-type components.

In FIG. 9, metal islands 22 are interposed between two adjacent FETs 3. Each metal island 22 has via-hole 23 provided in an approximately central portion thereof through which metal island 22 is grounded. Capacitors 15 are respectively disposed on metal islands 22. One of source terminals 6 of FET 3 is grounded via capacitor 15, metal island 22, and via-hole 23 with respect to the microwave current. The other one of source terminals 6 is grounded via resistor 14 with respect to the direct current. An air bridge or the like is used for connecting source terminal 6 with capacitor 15 and capacitor 15 with resistor 14. Capacitors 15 are in the form of a parallel plate capacitor. Resistors 14 are made of an epitaxial resistor or the like. FETs 3, resistors 14, capacitors 15, metal islands 22 and distributed constant circuits 18, 19 are integrally formed on a single semiconductor substrate as a monolithic integrated circuit.

In such a distributed amplifier employing a bias circuit as shown in FIG. 6, a number of FETs 3, capacitors 15 and resistors 14 are arranged on the semiconductor substrate in a nearly straight line. As a result, the distributed amplifier requires a greater width. Such a construction makes the semiconductor substrate susceptible to cracking. Such a construction is also disadvantageous in that the distance between FETs 3 is greater than the predetermined length of distributed constant circuits 18, thus making it impossible to embody a desired distributed amplifier.

In order to supply a bias voltage to such distributed FET amplifiers as shown in FIGS. 1, 4 and 8, a bias voltage supply circuit such as that shown in FIG. 10 may be employed, as disclosed by Japanese Patent Public Disclosure No. 233912/85. In FIG. 10, the reference numerals 24, 25 are distributed constant lines; 26 designates a resistor; 27, 28 and 29 are capacitors; and 30 and 31 are a voltage supply terminal and an output terminal, respectively.

In this bias voltage supply circuit, two distributed constant lines 24, 25 are disposed between voltage supply terminal 30 and output terminal 31. Distributed constant line 24 is grounded at its right-hand end (as viewed in the figure) via a series connection circuit consisting of resistor 26 and capacitor 27, and at its left-hand end via capacitor 28. Distributed constant line 25 is grounded at its left-hand end via capacitor 29. In such an arrangement, a low-pass filter consisting of distributed constant lines 24, 25, and capacitors 28, 29 can be regarded as being grounded at its right-hand end via a series connection circuit consisting of resistor 26 and capacitor 27. The voltage supply terminal is connected to a voltage source VS and output terminal 31 is connected to a wideband amplifier such as a distributed FET amplifier (not shown).

Distributed constant lines 24, 25 and a capacitors 28, 29, which constitute the low-pass filter, have parameters chosen such that the cut-off frequency of the low-pass filter is lower than a desired frequency band. Capacitor 27 has a capacitance chosen such that it produces an impedance small enough in the desired frequency band. As a result, the impedance viewed from the point A (FIG. 10) is substantially infinite in a desired frequency band. The impedance viewed from output terminal 31 to voltage supply terminal 30 is substantially equal to the resistance of resistor 26.

Accordingly, output terminal 31 is terminated by resistor 26 in the desired frequency band, making it possible to stabilize the operation of the wideband amplifier connected thereto. Furthermore, when a desired D.C. voltage is applied to voltage supply terminal 30 from voltage source VS, a bias voltage can be supplied to the wideband amplifier from output terminal 31 via distributed constant lines 24, 25 without any voltage drop.

However, such a bias voltage supply circuit, having the above mentioned construction, is disadvantageous in that the impedance viewed from the point A depends much on the impedance of voltage source VS connected to voltage supply terminal 30 unless the low-pass filter has many stages sufficient to make the impedance viewed from the point A infinite. Since the impedance viewed from output terminal 31 to voltage supply terminal 30 depends on the impedance of voltage source VS, the characteristics of the amplifier depend on the voltage source used. Sometimes the bias voltage supply circuit makes the operation of the wideband amplifier unstable.

SUMMARY OF THE INVENTION

It is a general object of the present invention to provide a distributed FET amplifier and a bias voltage supply circuit which overcome the disadvantages of the prior art.

It is a more specific object of the present invention to provide a distributed FET amplifier which keeps a desired gain over a wide frequency range.

In one embodiment of the distributed FET amplifier according to the present invention, a capacitor having a capacitance several times as large as the gate-source capacitance of FET elements is connected in parallel to an impedance element for grounding the direct current between the source terminal of each FET element and the ground.

Since the capacitor is connected between the source terminal of each FET element and the ground, each FET element can be given the positive feed back needed to raise its gain in a high frequency band, making it possible to keep the drop in the gain of the amplifier small in a high frequency range. Accordingly, each FET element is positively fed back in a high frequency, raising its gain. Thus, a distributed FET amplifier having a small gain drop in a high frequency range can be provided.

It is another object of the present invention to provide a distributed FET amplifier in which both the distance between adjacent FETs 1 and the width of a semiconductor substrate are sufficiently short in a monolithic integrated circuit configuration.

In another embodiment of the distributed FET amplifier according to the present invention, a plurality of FET sare arranged in parallel in a straight line. Disposed between the adjacent FETs is a metal island on which two capacitors each connected to the source terminal of one of the adjacent FETs are formed. One end of said metal island in the direction of the array of FETs is grounded through a via-hole. Each metal island is provided with a slit so that the capacitors connected to the source terminal of FETs are isolated from each other. The other end of each metal island is provided with a resistor connected to the source terminal of the FET.

In accordance with this embodiment, the resistors and the capacitors connected to the source terminal of FET and via-holes for grounding these resistors and capacitors are arranged transversely of the direction of the array of FETs so that the amplifier can be operated by a single power supply. In such an arrangement, only twice the width of the capacitors suffices as the minimum distance between the adjacent FETs. Therefore, the width of the semiconductor substrate necessary for the formation of the distributed amplifier comprising a parallel combination of a number of FETs can be made narrower, making it possible to prevent the semiconductor substrate from being damaged due to an increased width. Furthermore, the connection between the gate terminal and the drain terminal of the adjacent FETs can be easily made by a distributed constant line having a predetermined length.

It is still another object of the present invention to provide a bias voltage supply circuit in which the impedance viewed from the output terminal to the voltage supply terminal can be kept constant regardless of the impedance of a voltage source connected to the voltage supply terminal.

In order to achieve this object, the bias voltage supply, circuit of the present invention comprises a first distributed constant line means having one terminal thereof grounded via a capacitor and connected to a voltage supply terminal and a second distributed constant line mean having one terminal thereof open and the other terminal thereof connected to the other terminal of the first distributed constant line means and to an output terminal, said first and second distributed line means being connected to each other at one or several points via circuits comprising a resistor.

In the voltage supply circuit of the present invention, a microwave leaked to the bias volt age supply circuit from a utilization circuit connected to the output terminal is absorbed by the circuits comprising the resistors connecting the first and second distributed constant line means. The terminal of the first distributed constant line means to which the voltage source is connected is grounded through the capacitor with respect to a microwave. Accordingly, the impedance viewed from the output terminal to the voltage supply terminal can be kept constant regardless of the impedance of the voltage source. This means that the characteristics of the utilization circuit will not be affected by the voltage source, thus making it possible to stabilize the utilization circuit.

It is a further object of the present invention to provide a distributed FET amplifier of a type that combines the outputs from two travelling-wave FET amplifiers, enabling the travelling-waves to be isolated from each other over a wide frequency band.

In order to achieve this object, the distributed FET amplifier of power combining type according to the present invention comprises T-branch means for combining the outputs from the two travelling-wave FET amplifiers. Resistors having predetermined resistance valves are connected between the drain terminals of one of the travelling-wave FET amplifiers and those of the other of the travelling-wave FET amplifiers.

In the distributed FET amplifier of a power combining type according to the present invention, if there is imbalance between the two microwave components which have reached the T-branch means from the two travelling-wave amplifiers, the difference in amount between the two microwave components is absorbed by the resistors over a wide frequency band, thus providing isolation between the two travelling-wave FET amplifiers over a wide range. As a result, the gain of the amplifier can be maintained at a desired level and oscillator can be prevented from occurring.

BRIEF DESCRIPTION OF THE DRAWINGS

Other objects and advantages will be apparent from the ensuing description and drawings in which.

The same reference numerals are used in all of these figures to designate similar components or elements.

Figure 1:
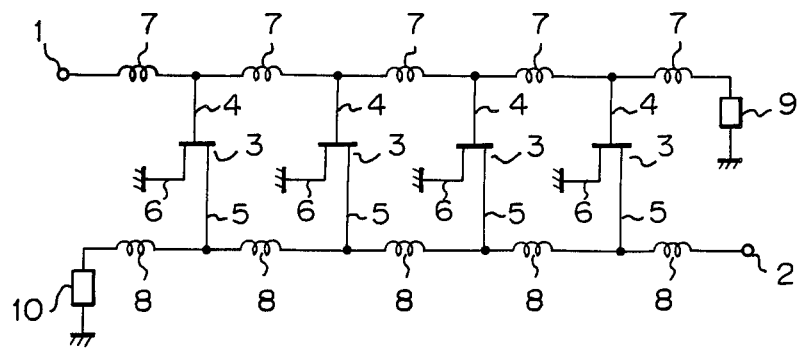
FIG. 1 is an equivalent circuit of the prior art distributed FET amplifier.
Figure 2:
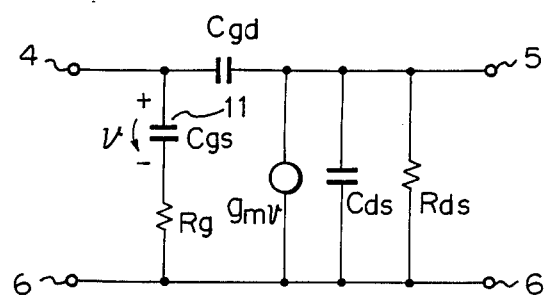
FIG. 2 is an equivalent circuit of a conventional FET element.
Figure 3:
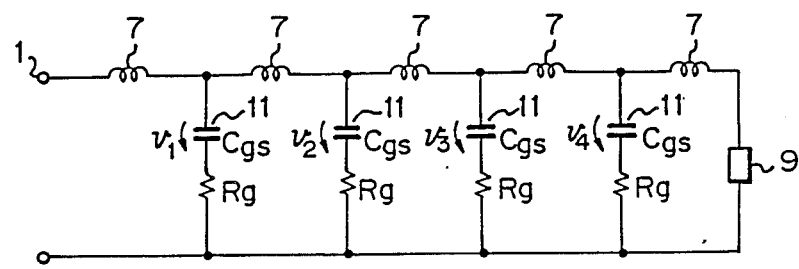
FIG. 3(a) and 3(b) are gate side and drain side equivalent circuits of the circuit of FIG. 1, respectively.
Figure 3:
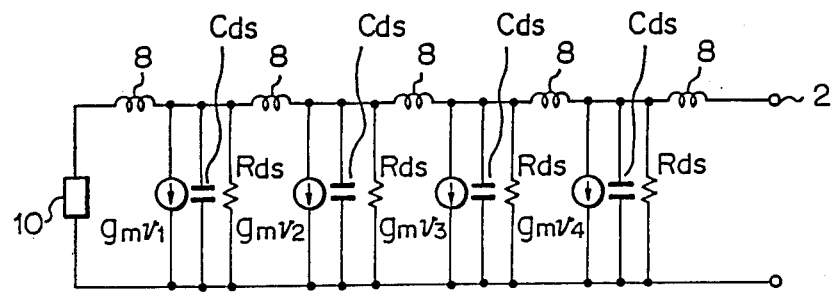
Figure 4:
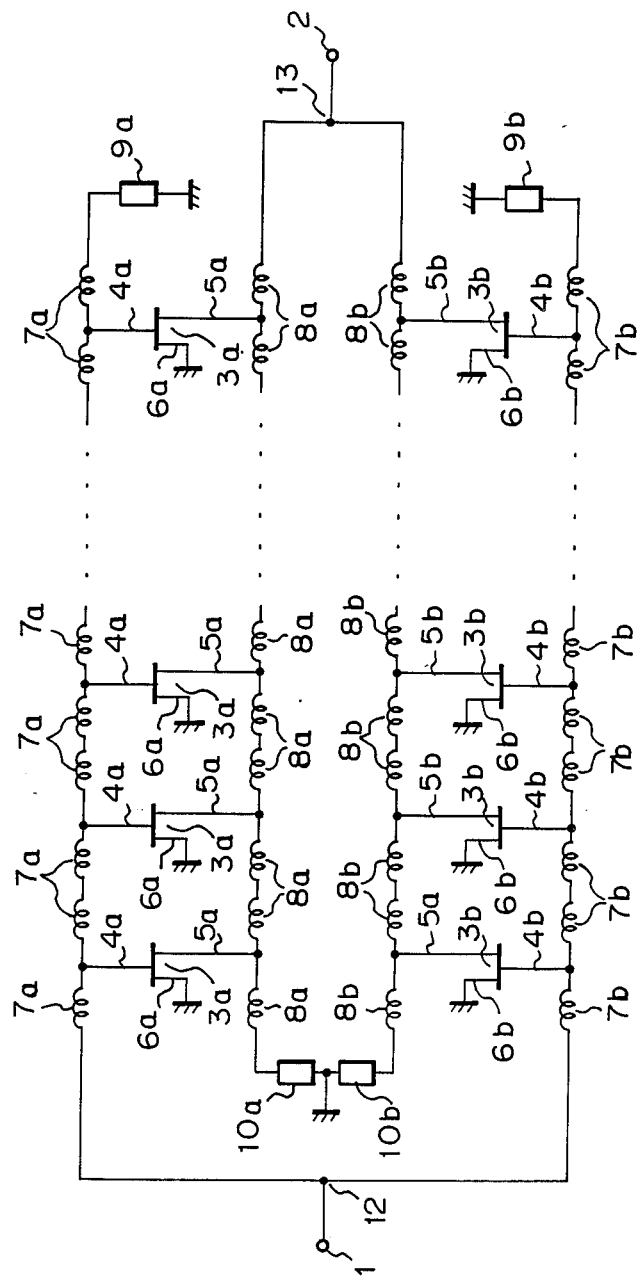
FIG. 4 is an equivalent circuit of another example of the prior art distributed FET amplifier of power combining type.
Figure 11:
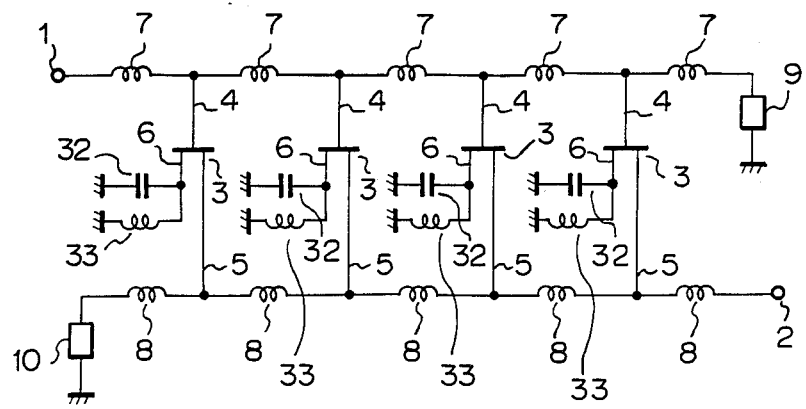
FIG. 11 is an equivalent circuit of a first embodiment of the distributed FET amplifiers according to the present invention.

DETAILED DESCRIPTION OF THE PREFERRED EMBODIMENTS:

Referring now to FIG. 11, there is shown a first embodiment of the distributed amplifier of the present invention. The components designated by the reference numerals 1 to 10 in FIG. 11 are similar to those shown in FIG. 1. This embodiment includes capacitor 32 connected between source terminal 6 of each FET element 3 and the ground, and inductor element 33 connected in parallel to each capacitor 32. The capacitance Cs of each capacitor 32 is selected to be several times as large as the gate-source capacitance Cgs of each FET element 3. The inductance Ls of each inductor 33 is selected such as to satisfy the following relationship:

$$2\pi f L s \gg 1/(2\pi f C s) \quad (2)$$

wherein f is the value of a frequency within the used frequency band.

In FIG. 11, the respective inductor elements 33 are adapted to ground source terminal 6 of each FET element 3 with respect to the direct current. Each capacitor 32 is adapted to connect a capacitive circuit between source terminal 6 of each FET element 3 and the ground so that each FET 3 is given a positive feed back, improving the gain of each FET.

Figure 12:
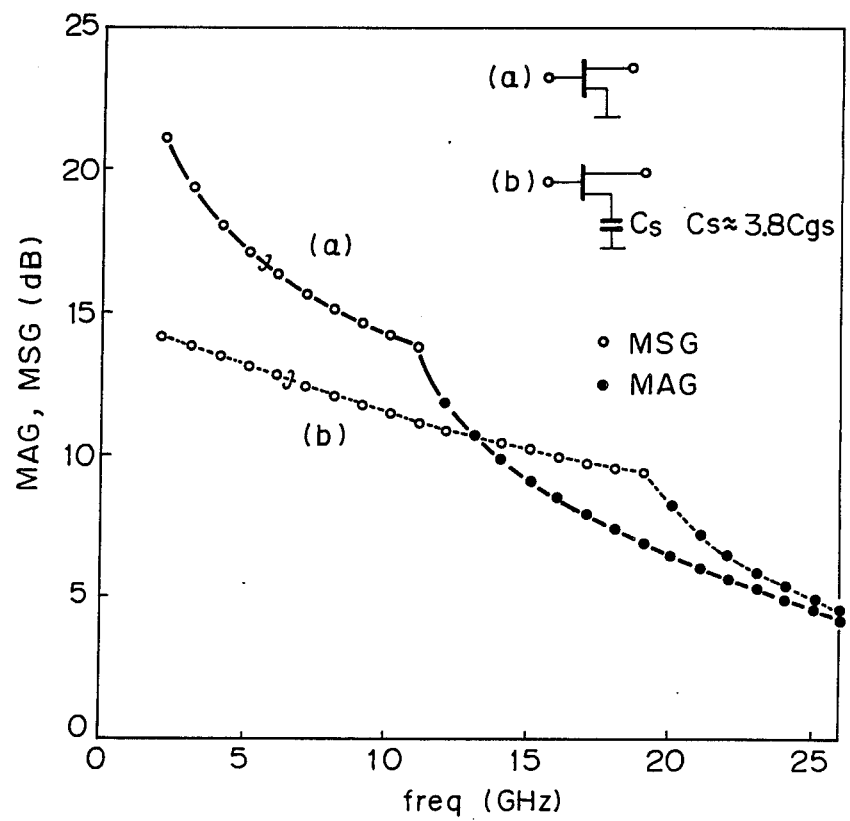
FIG. 12 is a characteristic diagram showing the calculation results of the maximum available gain and the maximum stable gain of the prior art of FIG. 1 and the first embodiment of the present invention.
Figure 13:
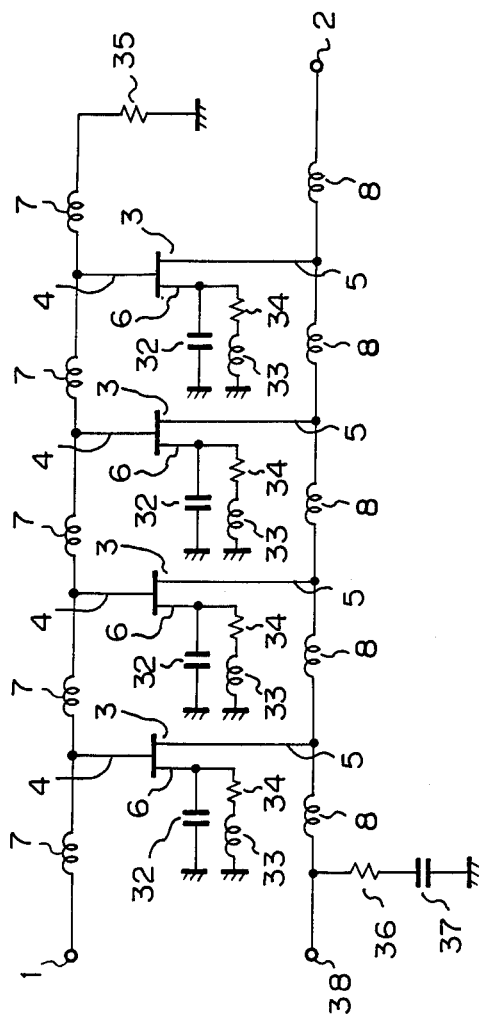
FIGS. 13 and 14 are equivalent circuits of second and third embodiments of the distributed FET amplifier of the present invention.

FIG. 12 shows a characteristic curve (solid line (a)) showing the calculated results of the maximum available gain (MAG) and the maximum stable gain (MSG) in the case where the source terminal of each FET element is directly grounded. The broken line (b) in FIG. 13 is a characteristic curve showing the calculated results of the maximum available gain (MAG) and the maximum stable gain (MSG) in the case where the source terminal of each FET element is grounded via capacitor 32. It should be noted that the broken line (b) shows the case where the Cs value is about 3.8 times as large as the Cgs value. The symbol o in the diagram shows MSG as defined in the case where stability index $K < 1$. The symbol o shows MAG in the case where stability index $K \geq 1$.

As shown in the characteristic diagram of FIG. 12, if the source terminal of FET element is grounded via a capacitor, the FET element is given a negative feed back due to its internal equivalent circuit parameters, thus giving a small drop in the gain of the FET circuit in a low frequency range (e.g. 12 GHz or lower). However, the FET circuit is given a positive feedback in a high frequency range (15 to 25 GHz), raising the gain of the FET circuit.

Thus, the distributed FET amplifier of FIG. 11 allows a small drop in the gain in a high frequency range, providing a wideband distributed FET amplifier.

FIG. 13 is an equivalent circuit of a second embodiment of the amplifier according to the present invention. In this embodiment, resistor 34 having resistance Rs is connected in series with inductor element 33 between inductor element 33 and the source terminal 6 of each FET element 3. Resistor 35 having one end directly grounded is used as the gate side terminating device. Furthermore, a series combination of resistor 36 and capacitor 37 is used as the drain side terminating device. Terminal 38 is provided for applying a drain bias voltage to the amplifier.

In FIG. 13, gate terminal 4 of each FET element 3 has little or no gate direct current and thus is grounded with respect to the direct current. When a positive voltage Vd is applied to terminal 38 and a direct current Id flows between the source and drain electrodes of each FET element 3, the resulting voltage drop Rs·Id across resistor S4 allows the reverse bias voltage Rs·Id to be applied between the gate and source electrodes. Accordingly, terminals 4, 5 and 6 of each FET element 3 are biased. Thus, only a single power supply can be used to operate the amplifier.

Figure 14:
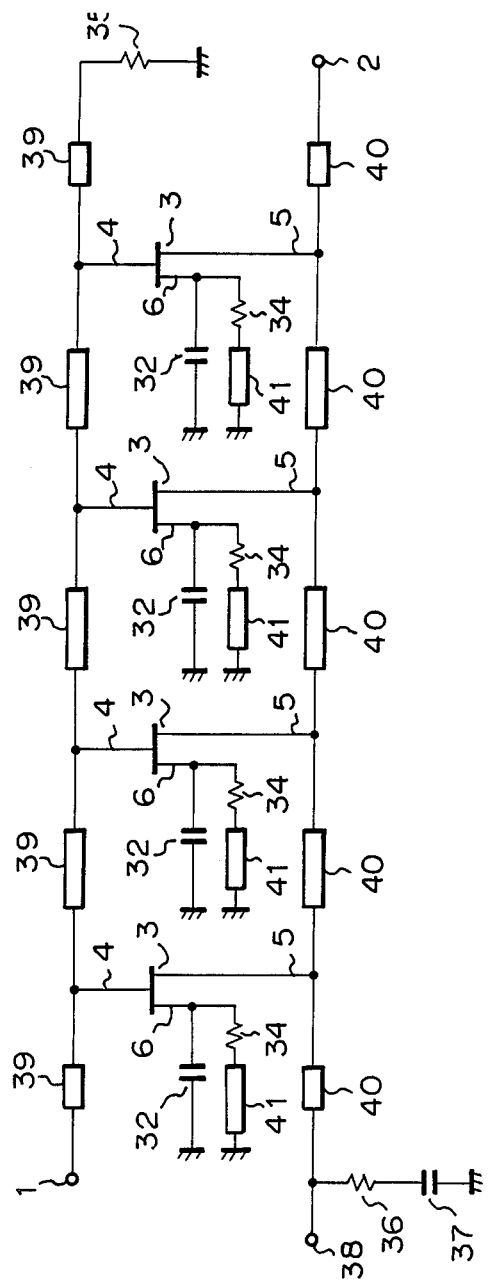

FIG. 14 is an equivalent circuit of a third embodiment of the amplifier according to the present invention. In this embodiment, inductor elements 7, 8 and 33 in FIG. 13 are replaced by distributed constant lines 39, 40 and 41, respectively. The operation of this amplifier is substantially similar to that of FIG. 13.

While these three embodiments of the distributed FET amplifier are described with reference to the case where four FET elements are used, a different number of FET elements can also be used. The distributed FET amplifier of the present invention may be in the form of a monolithic circuit comprising FET elements and circuit elements arranged on the same semiconductor substrate.

Figure 15:
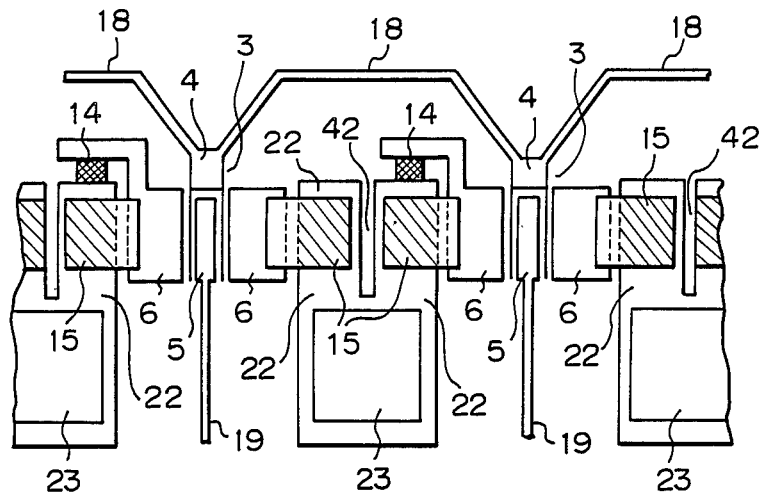
FIG. 15 is a plan view of an improved configuration of the distributed FET amplifier according to the present invention.

FIG. 15 shows an improved configuration of the distributed FET amplifier with the bias circuit according to the present invention. For the sake of brevity, only the circuit construction in the vicinity of two adjacent FETs 3, 3 is shown in the figure. The circuit construction in the vicinity of other FETs 3 is similar to this.

Disposed between two adjacent FETs 3, 3 is metal island 22 on which two capacitors 15, 15 are mounted to be connected to the source terminal 6 of each FET 3 via an air bridge or the like. The lower end, i.e. one end in the direction of the array of FETs, of each metal island 22 is grounded through via-hole 23. The other end of each metal island 22 is provided with a slit 42 disposed almost in parallel with FET 3 so that two capacitors 15, 15 are isolated from each other with respect to microwave power.

Connected to the upper end of the right half of the metal island split by slit 42 is one end of resistor 14. The other end of resistor 14 is connected to source terminal 6 of FET 3 disposed at the right hand thereof as viewed in the figure.

Figure 10:
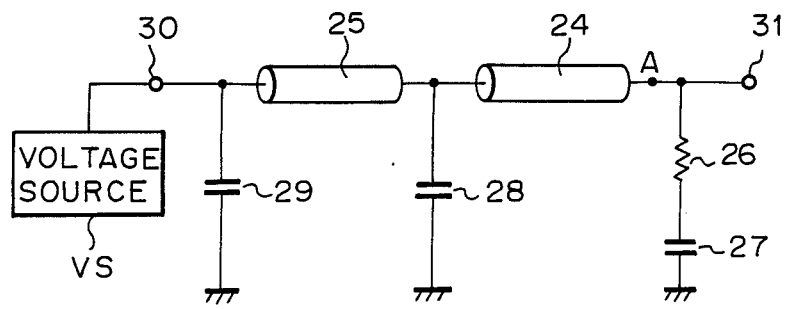
FIG. 10 is a bias voltage supply circuit of the prior art.

In the distributed amplifier having such an arrangement, resistors 14, capacitors 15 and via-holes 23 are arranged in a line transversely of the semiconductor substrate. In such a construction, only about twice the width of capacitor 15 will suffice as the predetermined distance between two adjacent FETs 3. Such an arrangement constitutes substantially the same equivalent circuit as that shown in FIG. 10 in which resistor 14, capacitor 15 and via-hole 23 are arranged lengthwise. The circuit construction shown in FIG. 16 can be easily formed as a monolithic integrated circuit on a semiconductor substrate.

The isolation of two adjacent capacitors 15 by slit 42 prevents the microwaves from interfering with each other between adjacent FETs 3 due to parasitic inductance present on metal island 22.

Figure 16:
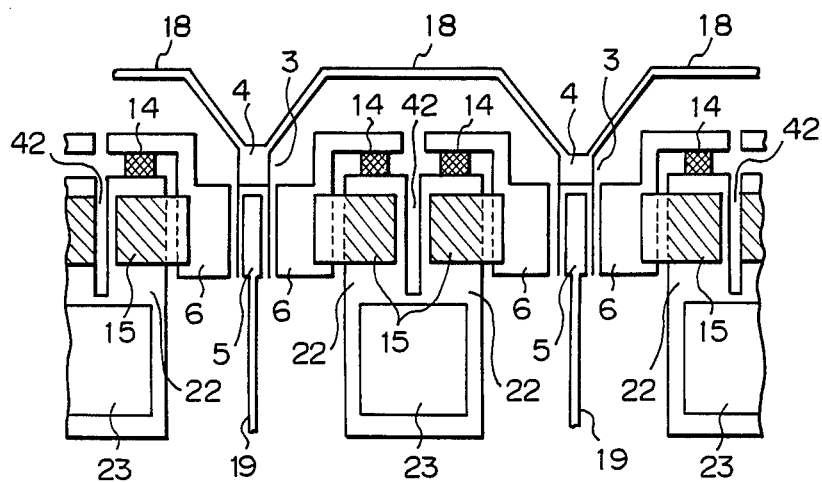
FIG. 16 is a plan view of a modified configuration of the distributed FET amplifier of the present invention.

While one resistor 14 is connected to only one half of the source terminal 6 of FET 3 in this embodiment, resistor 14 may alternatively be connected to each of the two halves of source terminal 6 as shown in FIG. 16. In this case, resistor 14 needs a resistance twice as large as that in the case where it is connected to only one half of source terminal 6.

Figure 17:
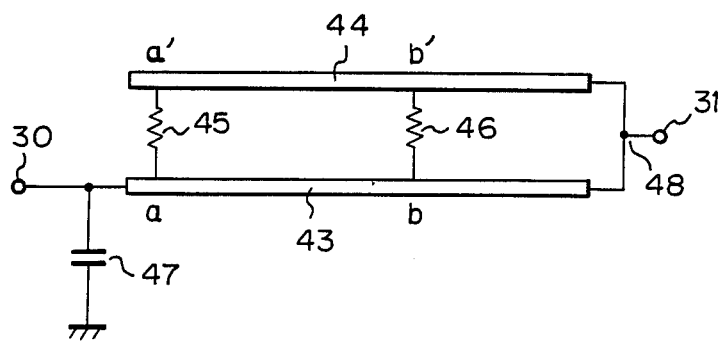
FIG. 17 is an equivalent circuit of a first embodiment of the bias voltage supply circuit of the present invention.

Referring now to FIG. 17, there is shown a first embodiment of the improved bias voltage supply circuit according to the present invention. In this figure, first and second distributed constant lines 43, 44 are provided between voltage supply terminal 30 and output terminal 31. The reference numerals 45, 46 designate resistors; and 47, 48 designate a capacitor and a T-branch circuit, respectively. Points a and b on line 43 and points a' and b' on line 44 are predetermined positions. First distributed constant line 43 has one terminal thereof grounded via capacitor 47 and connected to voltage supply terminal 30 and the other terminal thereof is connected via T-branch circuit 48 to output terminal 31 which is itself connected to the bias terminal of a device requiring a bias voltage. Second distributed constant line 44 has one terminal thereof open and the other terminal thereof connected to output terminal 31 via T-branch circuit 48. Resistor 45 interconnects predetermined point a on first distributed constant line 43 and predetermined point a' on second distributed constant line 44, and resistor 46 interconnects predetermined point b on first distributed constant line 43 and predetermined point b' on second distributed constant line 44. The lengths of first and second distributed constant lines 43, 44 are chosen to be equal to each other. The electrical length between output terminal 31 and point a is equal to that between output terminal 31 and point a'. Similarly, the electrical length between output terminal 31 and point b is equal to that between output terminal 31 and point b'. Capacitor 47 has a capacitance chosen such as to produce an impedance that is small enough in a desired frequency band.

In the bias voltage supply circuit having such an arrangement, a microwave received through output terminal 31 from a device connected thereto is equally divided by T-branch circuit 48. The two halves of the microwave thus equally divided propagate respectively toward voltage supply terminal 30 through first and second distributed constant lines 43, 44 in phase with each other and with an equal amplitude without being consumed by resistors 45, 46. These microwaves are entirely reflected by the lefthand terminal of first and second distributed constant lines 43, 44 as viewed in the figure, respectively, and propagate backward toward output terminal 31. However, since the lefthand terminal of first distributed constant line 43 is grounded via capacitor 47, and the lefthand terminal of second distributed constant line 44 is open, these microwaves thus reflected are out of phase with each other and have an equal amplitude. Therefore, the microwaves reflected at points a and a' are out of phase. Similarly, the microwaves reflected at points b and b' are out of phase. Accordingly, the reflected microwaves are consumed by resistors 45, 46 and thus do not return to output terminal 31. As a result, the impedance viewed from output terminal 31 to voltage supply terminal 30 becomes equal to the equivalent resistance determined by resistors 45, 46 and first and second distributed constant lines 43, 44 in a desired frequency band. Since the left-hand terminal of first distributed constant line 43 is grounded via capacitor 47 with respect to the microwave, the impedance viewed from output terminal 31 to voltage supply terminal 30 is kept constant regardless of the impedance of the bias voltage supply source connected to voltage supply terminal 30. Furthermore, when a D.C. bias voltage is applied to voltage supply terminal 30, the bias voltage can be supplied to the device such as a wideband amplifier from output terminal 31 via first distributed constant line 43 without any voltage drop.

Thus, this bias voltage supply circuit can not only keep constant the impedance viewed from output terminal 31 to voltage supply terminal 30 but can also operate without being affected by the bias voltage supply source connected to terminal 30.

Figure 18:
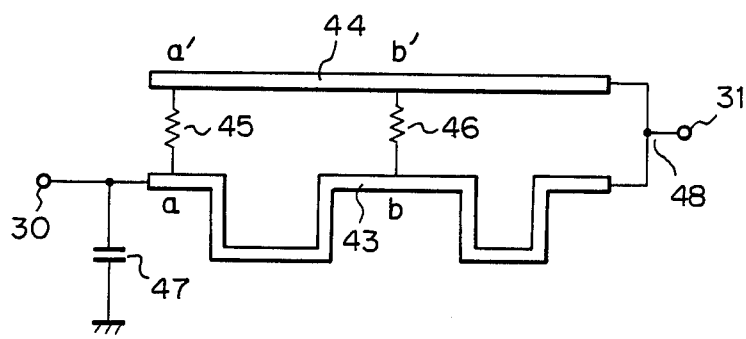
FIG. 18 is an equivalent circuit of a second embodiment of the bias voltage supply circuit of the present invention.

FIG. 18 is an equivalent circuit of a second embodiment of the bias voltage supply circuit according to the present invention. In this embodiment, first and second distributed constant lines 43, 44 having different lengths are used. Therefore, the electrical length between output terminal 31 and point b and the electrical length between output terminal 31 and point b' are different from each other. Similarly, the electrical length between output terminal 31 and point a and the electrical length between output terminal 31 and point a' are different from each other.

In such a bias circuit, a microwave received through output terminal 31 from the device connected thereto is equally divided by T-branch circuit 48. The two halves of the microwave thus equally divided propagate toward voltage supply terminal SO along first and second distributed constant lines 43, 44, respectively. Since the phase of the microwaves at point b is different from that at point b' and the phase of the microwave at point a is different from that at point a', the microwaves are partially consumed by resistors 45, 46, and the rest of the microwaves propagate toward the lefthand terminal of first and second distributed constant lines 43, 44, respectively. Each microwave is entirely reflected by the lefthand terminal of first and second distributed constant lines 43, 44 and then travels back toward output terminal 31. The two microwaves thus reflected are out of phase. Thus, these microwaves are consumed by resistors 45, 46, respectively, and do not reach output terminal 31.

As described above, a microwave that has passed through output terminal 31 is partially consumed by resistors 45, 46 while propagating toward voltage supply terminal 30. The rest of the microwave is reflected by the lefthand terminal of first and second distributed constant lines 43, 44, respectively, and is then consumed by resistors 45, 46. As a result, the bias voltage supply circuit of FIG. 18 operates in the same manner as that of FIG. 17.

Figure 19:
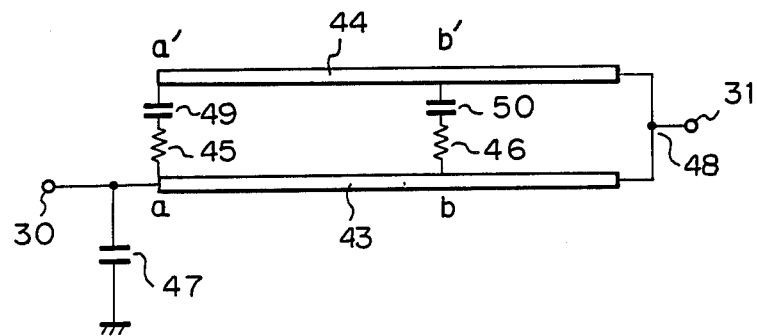
FIG. 19 is an equivalent circuit of a third embodiment of the bias voltage supply circuit of the present invention.

FIG. 19 shows a third embodiment of the bias voltage supply circuit of the present invention. This embodiment is different from the bias voltage supply circuit of FIG. 17 in that capacitors 49, 50 are connected in series with resistors 45, 46, respectively.

In this embodiment, the impedance of the series circuit comprising resistor 45 and capacitor 49 is determined by the capacitance of capacitor 49. This is also true to for the series circuit comprising resistor 46 and capacitor 50. Accordingly, the amount of microwave consumption effected by resistors 45, 46 can be changed by properly selecting capacitors 49, 50. Thus, the impedance viewed from output terminal 31 to voltage supply terminal SO can be set to a desired value.

Figure 20:
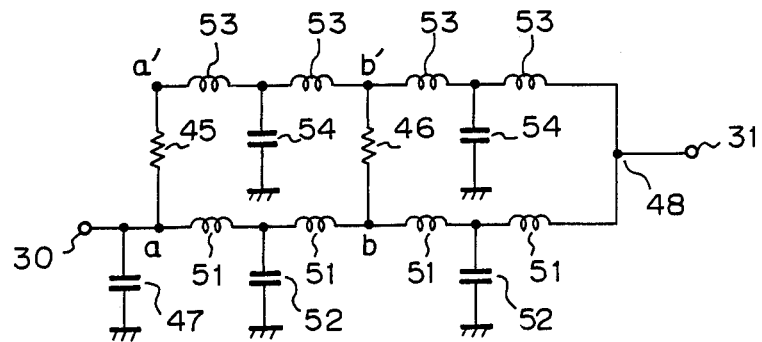
FIG. 20 is an equivalent circuit of a fourth embodiment of the bias voltage supply circuit of the present invention.

FIG. 20 shows a fourth embodiment of the bias voltage supply circuit of the present invention. This embodiment is different from the bias voltage supply circuit of FIG. 17 in that first distributed constant line 43 is replaced by inductors 51 and capacitors 52 and that second distributed constant line 44 is replaced by inductors 53 and capacitors 54. In lieu of first and second distributed constant lines 43, 44, lumped constant circuits such as inductors 51, 53 and capacitors 52, 54 are used, enabling a smaller bias voltage supply circuit to be provided.

While two resistors are used to connect the two distributed constant lines in the embodiments, shown in FIGS. 17–20, one or more than three resistors may be used to obtain the same effects.

The bias voltage supply circuit of the present invention can be used not only for wideband amplifiers but also for high output amplifiers or oscillators.

Figure 21:
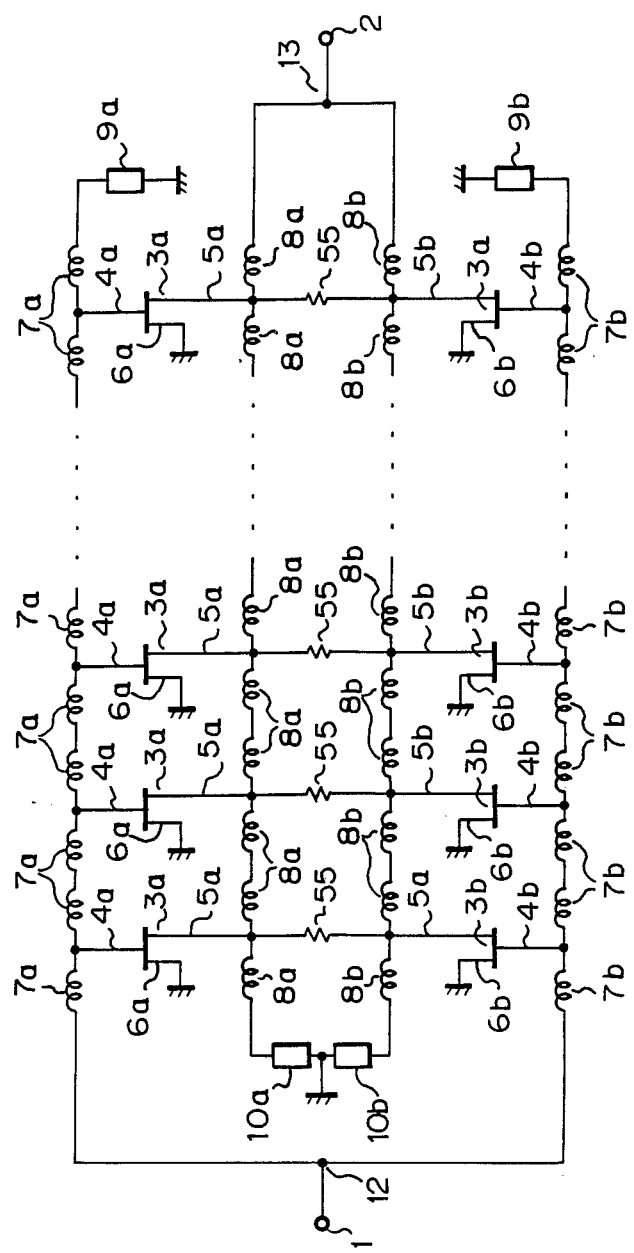
FIG. 21 is an equivalent circuit of a fourth embodiment of the distributed FET amplifier of the present invention.

Returning now to the improvement of distributed FET amplifiers, FIG. 21 shows a fourth embodiment of the distributed FET amplifier according to the present invention. In this figure, the drain terminal of each of the FETs located on the upper side is connected through a resistor 55 having a predetermined resistance to that of a corresponding FET located on the lower side.

In operation, microwave power input through input terminal 1 is divided into two halves by T-branch 12. One of the two halves of the microwave propagates through inductors 7a toward terminating device 9a. During propagation, the microwave power is partially supplied to each of FETs 3a by which it is amplified. The microwave power thus amplified propagates through inductors 8a to T-branch 13. The other half of the microwave power propagates through inductors 7b toward terminating device 9b. During propagation, the microwave power is partially supplied to each of FETs 3b by which it is amplified. The microwave power thus amplified propagates through inductors 8b to T-branch 13. The two microwave power components which have reached T-branch 13 are combined. The combined microwave power then reaches output terminal 2. When any imbalance occurs between the two microwave power components due to some dispersion of the characteristics of FETs 3a and 3b, the difference between these two microwave power components is absorbed by resistors 55 depending on the frequency, as described hereinafter, providing isolation of the two travelling-wave FET amplifiers over a wide frequency band.

The operation of the present distributed travelling-wave FET amplifier of power combining type will be further illustrated hereinafter with reference to the effects of resistors 55.

Figure 5A:
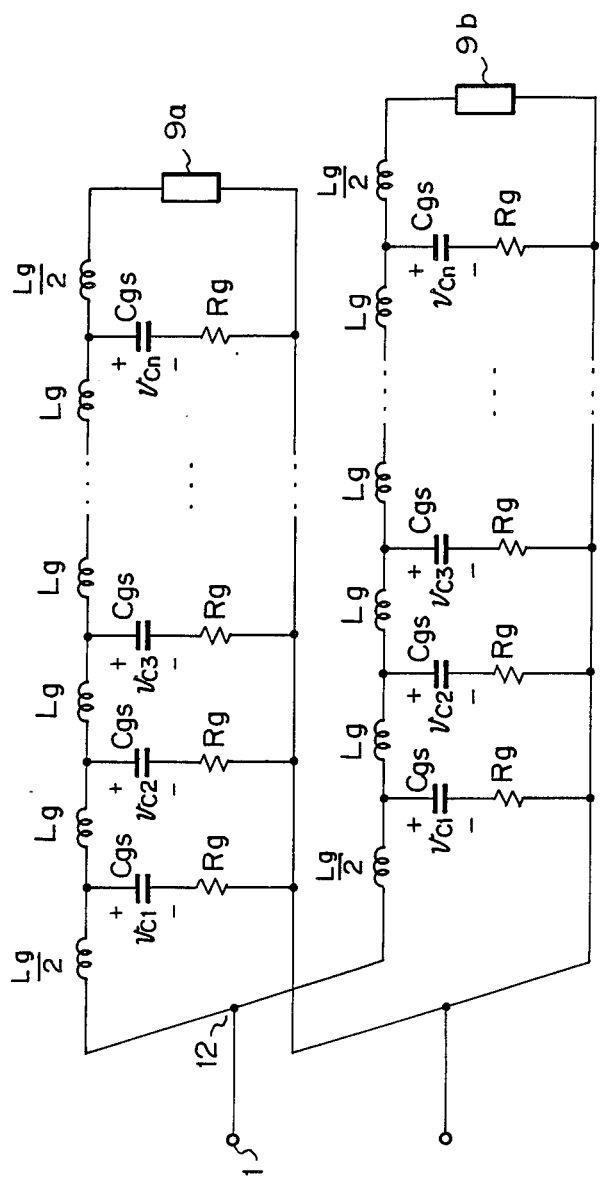
FIGS. 5(a) and 5(b), are gate side and drain side equivalent circuits of the equivalent circuit in FIG. 4, respectively.
Figure 5B:
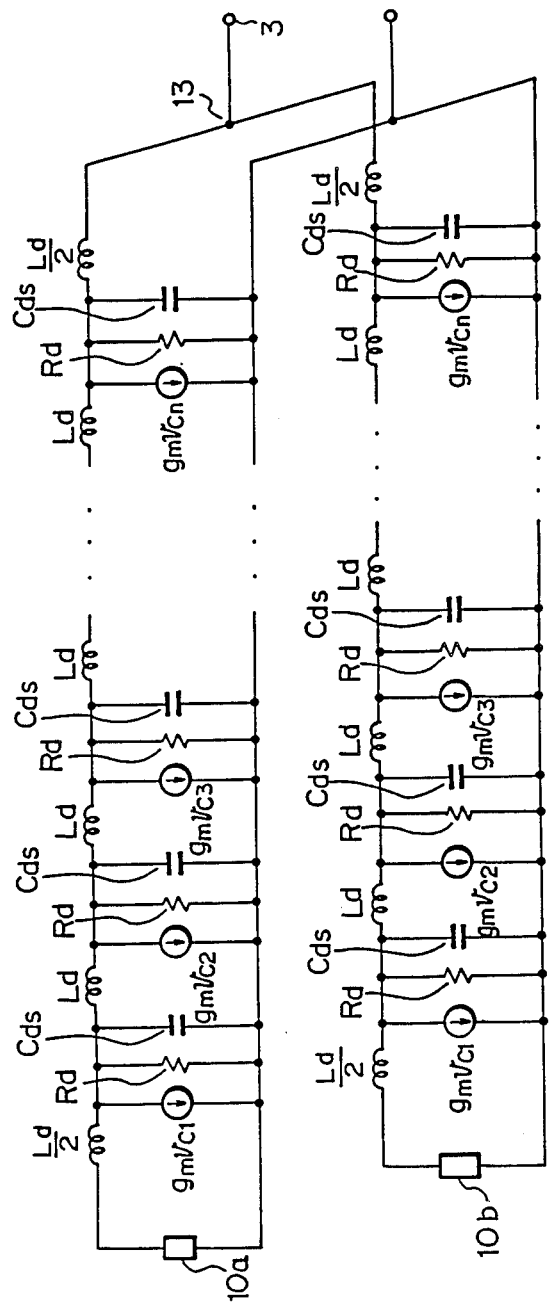
Figure 6:
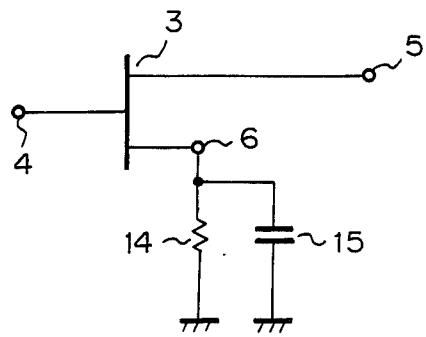
FIG. 6 is an example of a bias circuit for a distributed amplifier with a single power supply.
Figure 7:
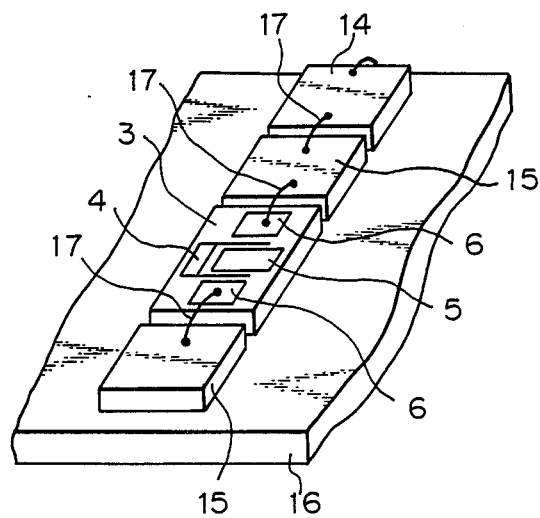
FIG. 7 is a perspective view illustrating an actual configuration of the prior art bias circuit shown in FIG. 6.
Figure 8:
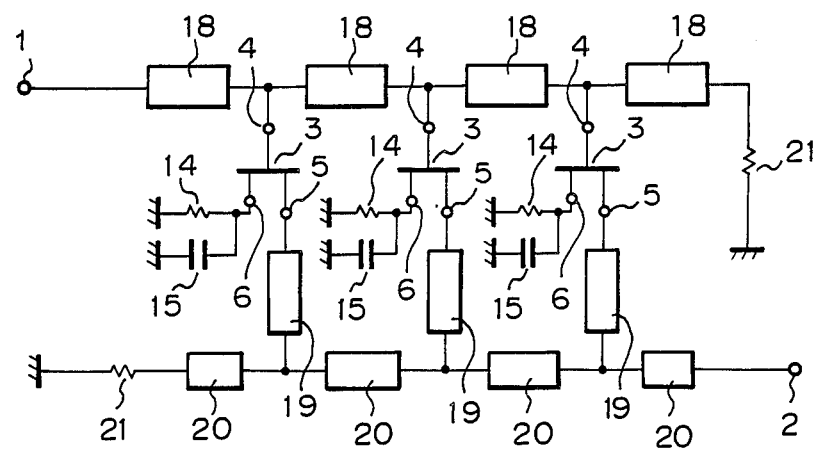
FIG. 8 is an equivalent circuit of a distributed amplifier comprising a plurality of FETs with the bias circuits of FIG. 6.
Figure 9:
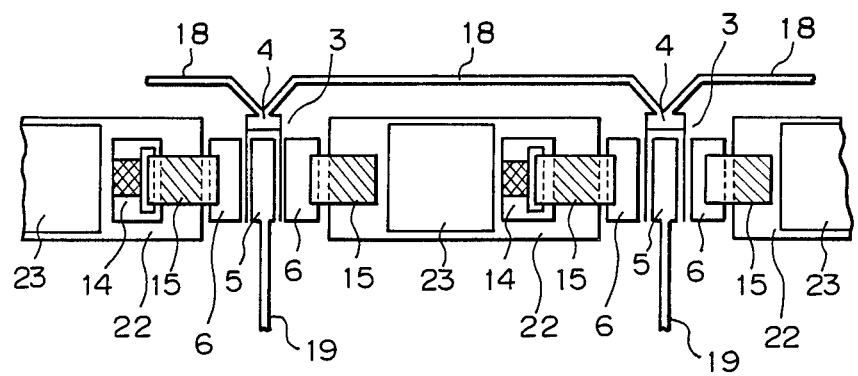
FIG. 9 is a plan view illustrating a configuration of the prior art distributed amplifier of FIG. 8.
Figure 22:
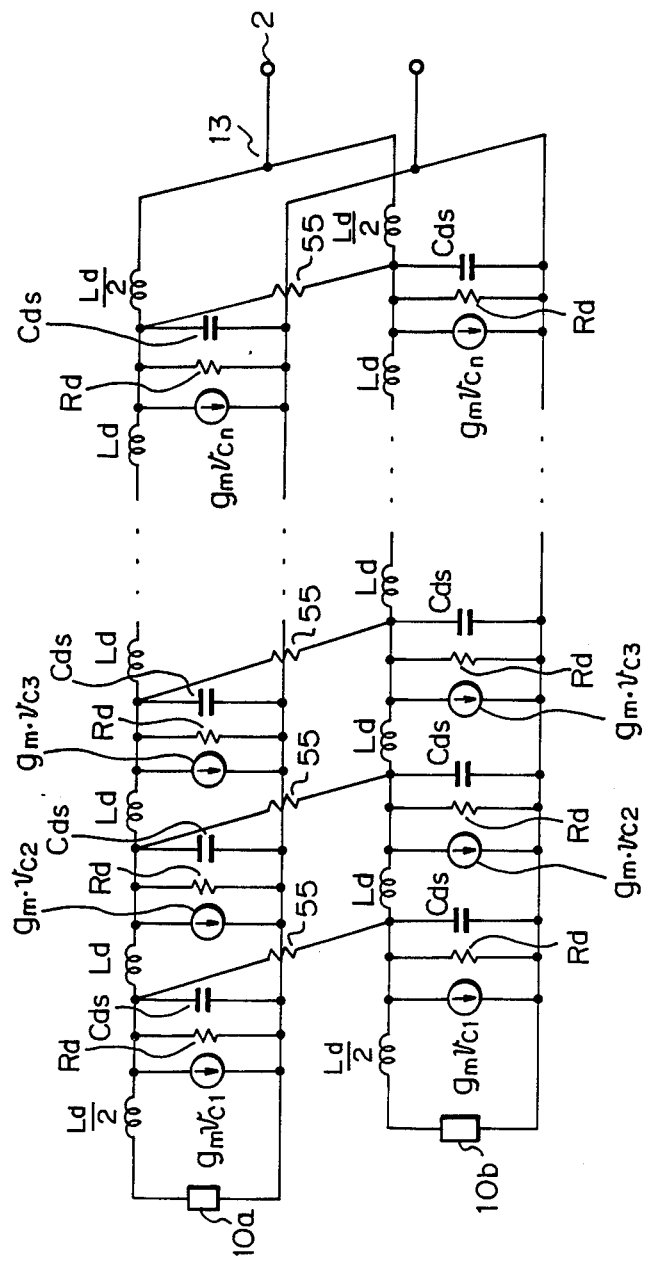
FIG. 22 is a drain side equivalent circuit of the amplifier in FIG. 21.

FIG. 22 is a drain side equivalent circuit of the amplifier in FIG. 21 which corresponds to FIG. 5(b). FIG. 22 shows circuit equivalent to a circuit in which two distributed constant lines having a loss are connected at predetermined opposing points thereof via resistors 55. Assuming that the impedance of the current source $g_m \cdot V_{ci}$ (i=1, 2, ..., n) is infinite, and that the source-drain resistance Rds is large enough to be able to ignore its loss effect, the circuit of FIG. 22 can be approximately represented by an equivalent circuit such as that of FIG. 23. The equivalent circuit of FIG. 23 includes two distributed constant lines 56a, 56b having the characteristic impedance of Z and a propagation speed of V, T-branch 13, and resistors $R_1, R_2, \ldots, R_n$ each connected between a predetermined point on distributed constant line 56a and a corresponding point on distributed constant line 56b.

In the above approximation, the following relationships are used:

$$Z \approx \sqrt{\frac{Ld}{Cds}}$$

$$V \approx \frac{1}{\sqrt{Ld \cdot Cds}}$$

Figure 23:
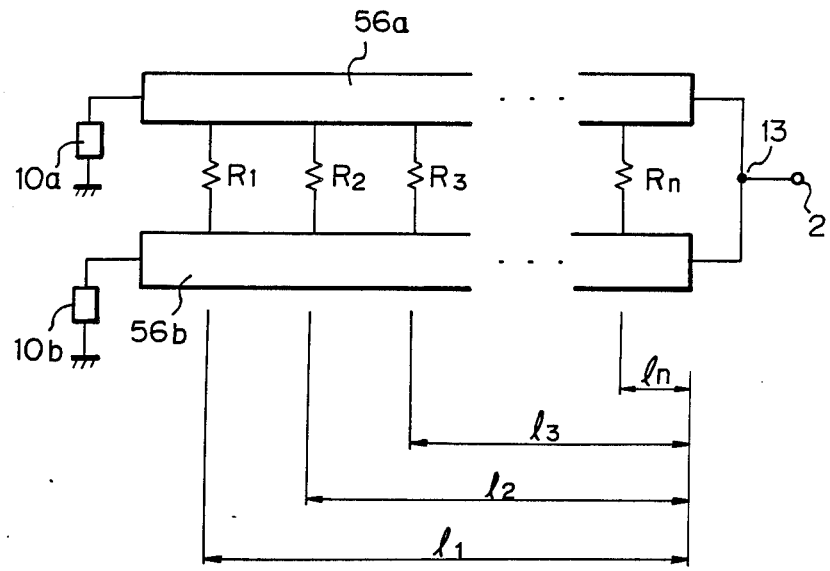
FIG. 23 is an equivalent circuit of the circuit of FIG. 22.

In FIG. 23, it is assumed that the distance between T-branch 13 and the respective resistors are $l_1, l_2, l_3 \ldots, l_n$, each of which represents a quarter wavelength at frequencies $f_1, f_2, f_3, \ldots, f_n$, respectively.

If the two microwaves propagating along the two distributed constant lines 56a, 56b are the same in phase and amplitude, there is not power dissipation through the resistors, and these microwaves are combined at T-branch 13 and passed to output terminal 2.

The operation of the distributed travelling-wave FET amplifier will be further illustrated hereinafter with reference to the case where there is some imbalance between the two microwaves which have reached T-branch 13. In accordance with the operation of a normal Wilkinson distributor, the difference between the two microwave power components at frequency $f_n$ is consumed by resistor $R_n$. In case of a microwave power at frequency $f_1$, the electric power due to such imbalance is mostly consumed by resistors $R_1, R_2, R_3, \ldots, R_n$. If the points to which these resistors are connected and the resistances $R_1, R_2, R_3, \ldots, R_n$ are properly selected, the electric power duo to the imbalance can be absorbed over a wide frequency band. As a result, good isolation can be provided between the two distributed constant lines 56a, 56b over a wide frequency band.

The arrangement shown in FIG. 23 is different from an ideal Wilkinson distributor in configuration; so it is impossible to provide ideal isolation at each frequency. However, in the power-combining travelling-wave FET amplifier of FIG. 21, the two microwaves which have reached T-branch 13 have substantially the same phase and amplitude. Accordingly, even if an ideal isolation cannot be provided at each frequency, there is no problem.

Figure 24:
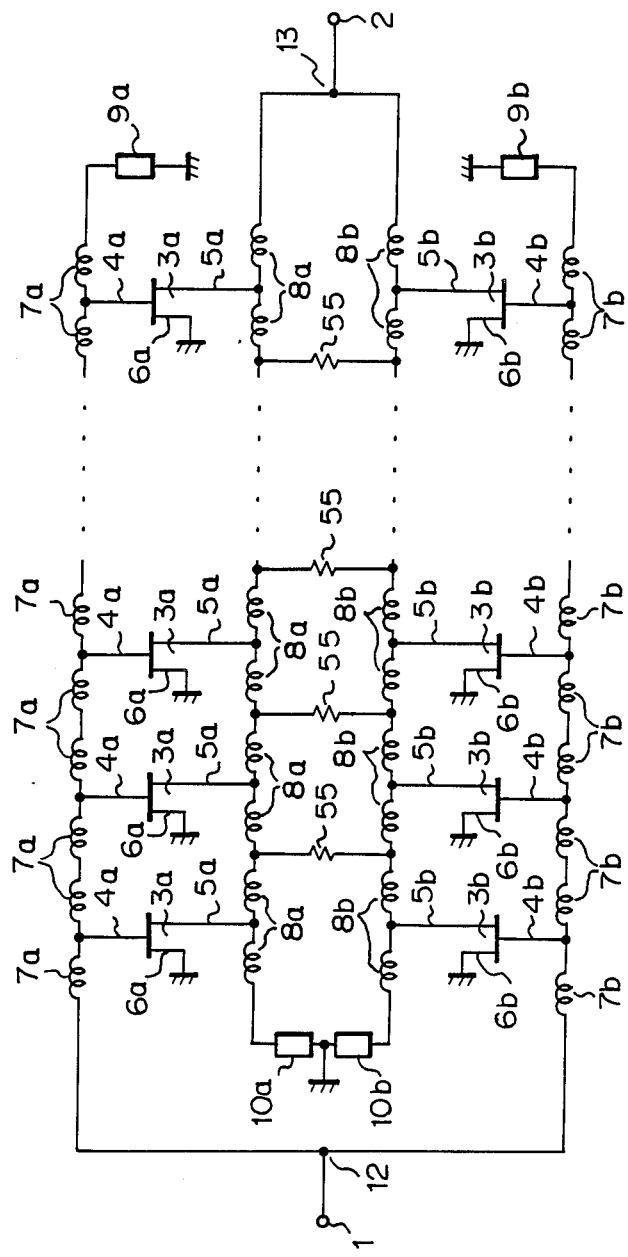
FIG. 24 is an equivalent circuit of a fifth embodiment of the distributed FET amplifier of the present invention.

FIG. 24 is an equivalent circuit of a fifth embodiment of the distributed FET amplifier according to the present invention in which resistors 55 are mounted at positions different from those in FIG. 22. Thus, the points at which resistors are mounted are optional.

Figure 25:
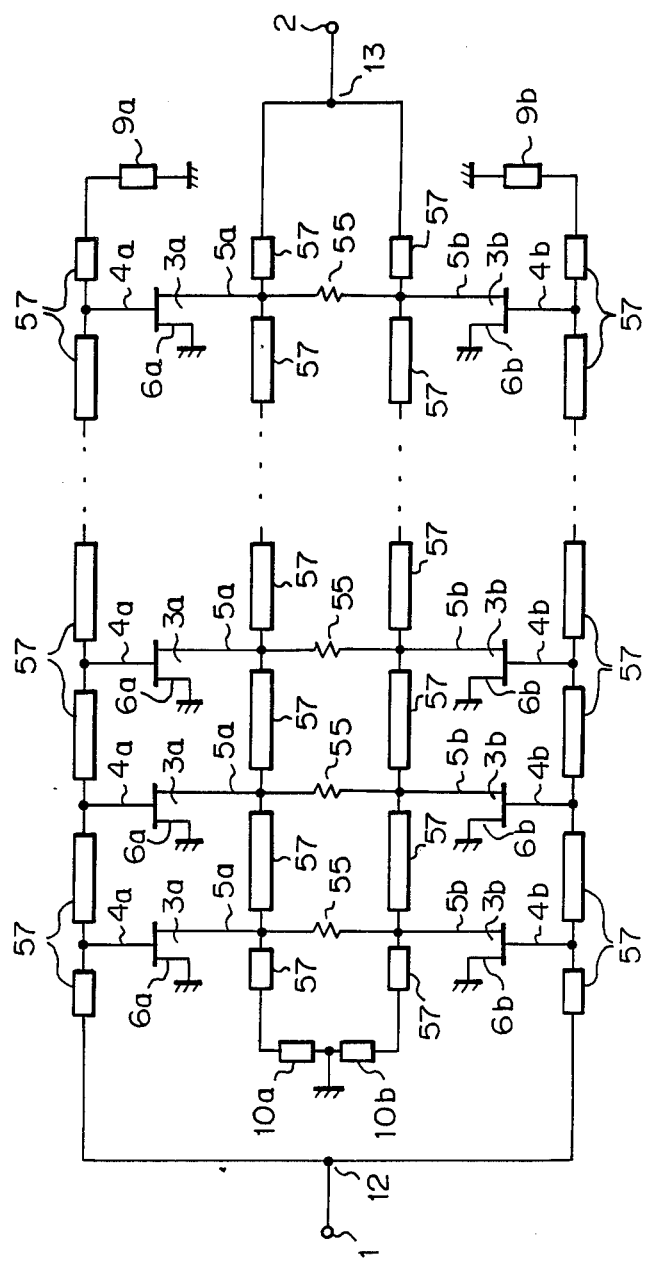
FIG. 25 is an equivalent circuit of a sixth embodiment of the distributed FET amplifier of the present invention.

While the fourth and fifth embodiments comprise inductors of lumped constant circuit elements as reactance circuits, it will be apparent to those skilled in the art that the present invention is not limited to such embodiments. For example, microstrip circuits as shown at 57 in FIG. 25 may be used in lieu of the inductors.

While prepared embodiments of the present invention have been described and illustrated herein, a person skilled in the art will appreciate that changes and modifications may be made therein without departing from the spirit and scope of this invention as defined by the appended claims.

What is claimed is:

1. A distributed FET amplifier comprising an array of FET elements each having a gate terminal, a drain terminal and a source terminal, first inductor means interconnecting the gate terminals of the adjacent FET elements, second inductor means interconnecting the drain terminals of the adjacent FET elements, an input terminal connected to supply a microwave to said array, an output terminal to be supplied with an amplified microwave, a first terminating means connected between the drain terminal of the FET element positioned at the left end of said array and the ground, and a second terminating means connected between the gate terminal of the FET positioned at the right end of said array and the ground, characterized in that capacitor means having a capacitance greater than the gate-source capacitance of each of said FET elements and inductance element means for grounding the direct current are connected in parallel to each other between the source terminal of each of said FET elements and the ground.

2. An amplifier as claimed in claim 1, wherein said inductance element means comprises a distributed constant line.

3. An amplifier as claimed in claim 1, wherein said capacitor means has a capacitance several times as large as said gate-source capacitance and produces a reactance much smaller than that produced by said inductance element means for grounding the direct current in a used frequency.

4. An amplifier as claimed in claim 3, wherein said inductance element means comprises a distributed constant line.

5. An amplifier as claimed in claim 1 or 3, wherein said inductance element comprises a series combination comprising an inductance element and a resistor, said first terminating means is a series combination comprising a resistor and a capacitor connected between the terminal t o which a drain bias is applied and the ground, and said second terminating means is a resistor for grounding the direct current.

6. An amplifier as claimed in claim 5 wherein said inductance element means comprises distributed constant circuit.

7. A distributed FET amplifier formed as a monolithic integrated circuit on a semiconductor substrate and including an array of FET elements each having a gate terminal, a drain terminal and a source terminal, first inductor means interconnecting the gate terminals of the adjacent FET elements, second inductor means interconnecting the drain terminals of the adjacent FET elements, resistors each interconnecting the source terminal of each of said FET elements and the ground, and capacitors each connected in parallel to said resistor between said source terminal and the ground, said distributed amplifier comprising:

a plurality of metal islands arranged alternately with said FET elements in a nearly straight line, each of said capacitors being formed to connect the source terminal of one of the adjacent FET elements and the metal island positioned between said adjacent FET elements; and slits formed on said metal islands such as to separate adjacently disposed capacitors formed on each of said metal islands; said resistor being connected between said metal islands and the source terminals of said FET elements.

8. An amplifier as claimed in claim 7, wherein said slits are formed in the direction perpendicular to the direction of said array, the length of the slits is smaller than that of one side of said metal islands perpendicular to the direction of said array, thereby constituting two portions in each of said metal islands.

9. An amplifier as claimed in claim 8 wherein each of said resistors is connected between one of said two portions and the source terminal of said one of the adjacent FET elements.

10. An amplifier as claimed in claim 8, wherein each of said resistors comprises a first resistor interconnecting one of said two portions and the source terminal of one of said adjacent FET elements and a second resistor interconnecting the other of said two portions and the source terminal of the other of said adjacent FET elements.

11. A bias voltage supply circuit for supplying a bias voltage to an electric circuit such as a distributed FET amplifier, said supply circuit comprising:

an input terminal connected to a voltage source;

an output terminal connected to said electric circuit for supplying a bias voltage thereto:

a first distributed constant line means, one end thereof being connected to said input terminal and grounded through a capacitor;

a second distributed constant line means, one end thereof being open and the other end thereof being connected to the other end of said first distributed constant line means and to said output terminal: and at least one circuit including a resistor connected between a point on said first distributed constant line means and a point on said second distributed constant line means.

12. A supply circuit as claimed in claim 11, wherein said first and second distributed constant line means have the same length and wherein said circuits are connected between points on said lines at the same distance from said output terminal.

13. A supply circuit as claimed in claim 12, wherein said circuit comprises a series combination comprising a resistor and a capacitor.

14. A supply circuit as claimed in claim 11 wherein said first and second distributed constant line means have different lengths.

15. A distributed FET amplifier having a pair of travelling-wave FET amplifiers disposed in parallel with each other, each of said travelling-wave FET amplifiers comprising an array of FET elements each having a gate terminal, a drain terminal and a source terminal, first reactance circuit means having a predetermined value and interconnecting the gate terminals of the adjacent two FET elements in said array, second reactance circuit means having a predetermined value and interconnecting the drain terminals of the adjacent two FET elements in said array, said distributed FET amplifier being characterized in that T-branch means combines the outputs from said pair of travelling-wave FET amplifiers, and that resistors having a predetermined resistance value interconnect the drain terminals of one travelling-wave FET amplifier and the corresponding drain terminals of the other travelling-wave FET amplifier.

16. An amplifier as claimed in claim 15, wherein said resistors are positioned from a quarter wave-length of the respective frequencies within a desired frequency band.

17. An amplifier as claimed in claim 15 or 16, wherein said first and second reactance circuits comprise distributed constant line.

18. A distributed FET amplifier comprising an array of FET elements each having a gate terminal, a drain terminal and a source terminal, first inductor means interconnecting the gate terminals of the adjacent FET elements, second inductor means interconnecting the drain terminals of the adjacent FET elements, an input terminal connected to supply to supply a microwave to said array, an output terminal to be supplied with an amplified microwave, a first terminating means connected between the drain terminal of the FET element positioned at the left end of said array and the ground, and a second terminating means connected between the gate terminal of the FET positioned at the right end of said array and the ground, characterized in that capacitor means having a capacitance greater than the gate source capacitance of each of said FET elements and a series combination of inductance element means and resistor means are connected in parallel to each other between the source terminal of each of said FET elements and the ground, and that said first terminating means is a series combination comprising resistor means and capacitor means connected between the terminal to which a drain bias is applied and the ground, said second terminating means being resistor means for grounding the direct current.

19. An amplifier as claimed in claim 18, wherein said inductance element means is a distributed constant line.

20. A distributed FEET amplifier formed as a monolithic integrated circuit on a semiconductor substrate, comprising:

an array of FET elements each having a gate terminal, a drain terminal and a source terminal having two sections;

first inductor means interconnecting the gate terminals of the adjacent FET elements;

second inductor means interconnecting the drain terminals of the adjacent FET elements;

resistors each interconnectors the source terminal of each of said FET elements and the ground;

capacitors each having a first capacitor connected in parallel to said resistor between one section of the source terminal of each FET element and the ground and a second capacitor interconnecting the other section of the source terminal of each FET element and the ground; and a plurality of metal islands arranged alternately with said FET elements in a nearly straight line to be used for forming said first and second capacitors, each of said metal islands having a slit formed such as to separate said first and second capacitors formed on each of said metal islands, said resistors being connected between said metal islands and said one section of the source terminals of said FET elements.

21. An amplifier as claimed in claim 20, wherein said slits are formed in the direction perpendicular to the direction of said array, the length of the slits is smaller than that of one side of said metal islands perpendicular to the direction of said array, thereby constituting two portions in each of said metal islands.

22. An amplifier as claimed in claim 21, wherein each of said resistors is connected between one of said two portions and the source terminal of said one section of the adjacent FET elements.

23. An amplifier as claimed in claim 21, wherein each of said resistors comprises a first resistor interconnecting one of said two portions and the source terminal of one of said adjacent FET elements and a second resistor interconnecting the other of said two portions and the source terminal of the other of said adjacent FET elements.

24. A bias voltage supply circuit for supplying a bias voltage to an electric circuit such as a distributed FET amplifier, said supply circuit comprising:

an input terminal connected to a voltage source;

an output terminal connected to said electric circuit for supplying a bias voltage thereto;

a first lumped constant line means, one end thereof being connected to said input terminal and grounded through a capacitor;

a second lumped constant line means, one end thereof being open and the other end thereof being connected to the other end of said first lumped constant line means and to said output terminal; and at least one circuit including a resistor connected between a point on said first lumped constant line means and a point on said second lumped constant line means.

25. A supply circuit as claimed in claim 24, wherein said first and second lumped constant line means comprise inductors and capacitors.

26. In a distributed FET amplifier having an input terminal and an output terminal and including an array of FET elements each having a gate terminal, a drain and a source terminal, first inductor means interconnecting the gate terminals of the adjacent FET elements, second inductor means interconnecting the drain terminals of the adjacent FET elements, capacitor means having a capacitance greater than the gate-source capacitance of each of said FET elements, an inductance element, and means coupling the capacitor means and inductance element in parallel between the source terminal of each of said FET elements and a voltage reference.

27. An amplifier as claimed in claim 26 wherein said inductance element comprises a distributed constant line.

28. An amplifier as claimed in claim 26 wherein said capacitor means has a capacitance several times as large as said gate-source capacitance and produces a reactance much smaller than that produced by said inductance element for grounding the direct current in a used frequency.

29. An amplifier as claimed in claim 26 wherein said inductance element comprises a series combination comprising an inductance element and a resistor, and further comprising a first terminating means comprising a resistor and a capacitor connected in series between the terminal to which a drain bias is applied and ground, and a second terminating means comprising a resistor for grounding the direct current.

* * * * *